(12) United States Patent
Kamei (10) Patent No.: US 6,223,990 B1
(45) Date of Patent: May 1, 2001

(54) COMMUNICATION SYSTEM INCLUDING A DUAL PASSIVE ANTENNA CONFIGURATION (75) Inventor: Shinji Kamei, Shiga (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 08/973,564

(22) PCT Filed: Jun. 13, 1996

(86) PCT No.: PCT/JP96/01622

§ 371 Date: Mar. 3, 1998

§ 102(e) Date: Mar. 3, 1998

(87) PCT Pub. No.: WO97/00493

PCT Pub. Date: Jan. 3, 1997

(Under 37 CFR 1.47)

(30) Foreign Application Priority Data

Jun. 16, 1995 (JP) .................................................... 7-150605
Jan. 24, 1996 (JP) .................................................... 8-010463

(51) Int. Cl.⁷ .................................................... G06K 19/06
(52) U.S. Cl. ............................ 235/492; 235/487; 235/451
(58) Field of Search ................................. 235/492, 380, 235/382, 385, 449, 451, 487; 902/2; 340/825.54, 825.34, 825.53, 825.69, 825.72

(56) References Cited

U.S. PATENT DOCUMENTS 5,444,222 * 8/1995 Inoue .................................... 235/380
5,585,617 * 12/1996 Ohbuchi et al. .................. 235/492 X
5,889,273 * 3/1999 Goto ...................................... 235/492
6,021,951 * 2/2000 Nishikawa ............................ 235/494

FOREIGN PATENT DOCUMENTS 3-262089 * 11/1991 (JP) .
4-7689 * 1/1992 (JP) .
4-47389 * 2/1992 (JP) .

* cited by examiner

Primary Examiner—Michael G. Lee
Assistant Examiner—Jamara A. Franklin
(74) Attorney, Agent, or Firm—Baker Botts, LLP (57) ABSTRACT An IC card which is facilitated in circuit configuration and program-development as well as a communication system which is improved in characteristics such as the rate of communication and the distance of communication. An IC card 10 comprises an antenna 22a for receiving an electromagnetic wave for supplying electric power, an antenna 22b for receiving an electromagnetic wave for data, a rectifying circuit 11 with a capacitor 6 to rectify the received electromagnetic wave to get electric power, a power source circuit 12 for supplying a power source voltage to an internal circuit of the IC card 10 by the use of the electric power obtained, a detecting circuit 13 for detecting a component of data from the received electromagnetic wave, a modulating/demodulating circuit 14 for demodulating the received data and modulating data to be transmitted, an oscillation circuit 1 for generating a clock signal CP to be supplied into internal circuits, and a semiconductor device such as a microcomputer and memories, not shown, for processing and storing the data obtained.

6 Claims, 6 Drawing Sheets

COMMUNICATION SYSTEM INCLUDING A DUAL PASSIVE ANTENNA CONFIGURATION

TECHNICAL FIELD

This invention relates to a semiconductor device incorporating into an oscillating circuit, an IC card utilizing the same and a communication system.

BACKGROUND ART

In recent years, a proximity type IC card, hereinafter abbreviatedly called as "the IC card" has being brought into usage, which is capable of confirming and updating data contained therein without manually passing through a card reader at a card gate or the like, whenever it is used. Such card, called as "a radio-frequency tag" is used as a card tag in an application such as coupon tickets for skiing-ground rifts, coupon or commuter tickets for trains or buses, inventory management, and so on.

Figure 4:
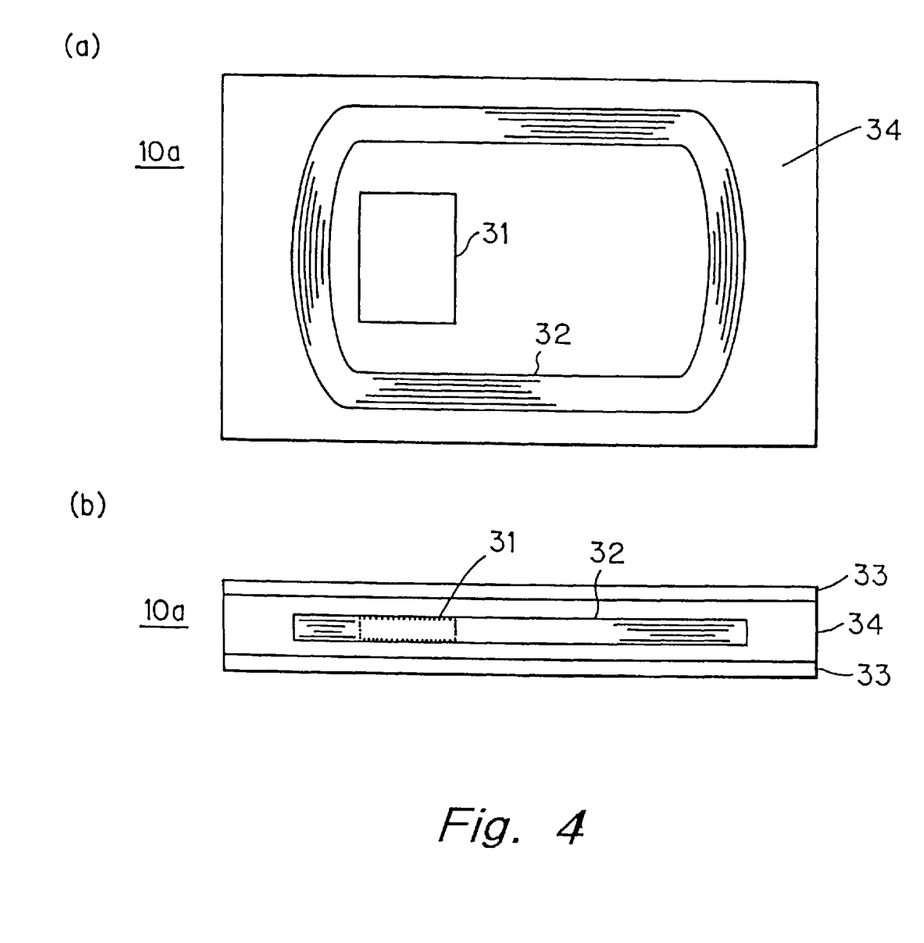
FIG. 4 is an explanatory view showing a structure of a conventional proximity type IC card.

The IC card of this kind has a structure as shown in FIG. 4, wherein in (a) of FIG. 4 is a perspective view viewed from the above and in (b) of FIG. 4 a perspective view viewed from the side. As shown in the figure, a fixing resin 34 has a thickness of approximately 0.5 to 2.0 mm to incorporate to fix therein a substrate 31 which has semiconductor devices and discrete electronic parts previously mounted thereon and an antenna 32 formed spiral in the form of a coil. The fixing resin 34 has a surface patched with a film 33, which is formed of polyethylene-terephthalate, or PET, or the like to a thickness of approximately 0.1 mm to have a given mark assigned previously. The substrate 31 has a wiring pattern formed beforehand by printing to allow mounting thereon a semiconductor device such as a micro-computer and memories as well as discrete electronic components involving resistors, capacitors, etc. The antenna 32, serving for transmission and reception of an electromagnetic waves, constitutes a tuning circuit in association with a capacitor forming a resonant circuit.

Figure 5:
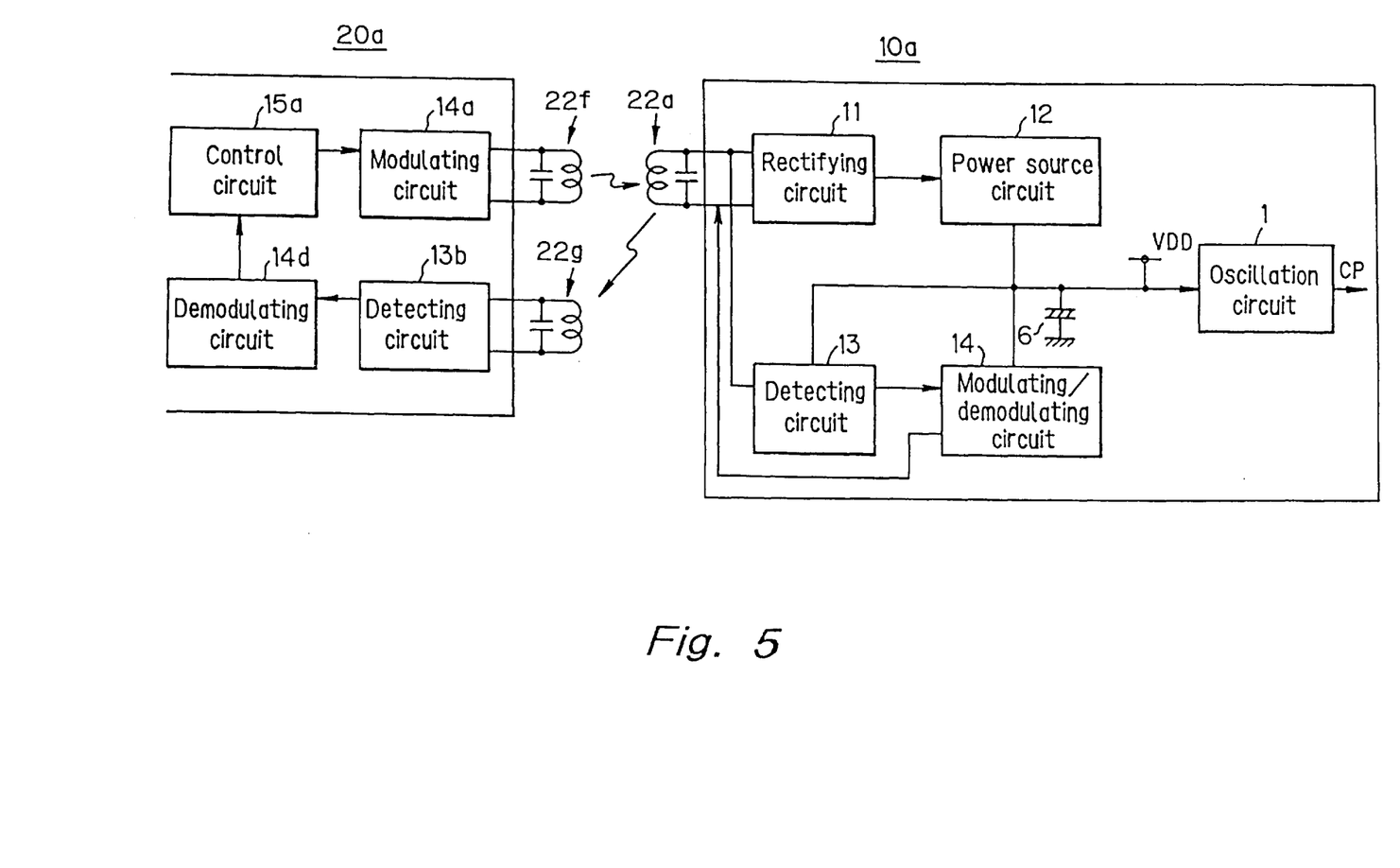
FIG. 5 is an explanatory diagram showing the conventional proximity type IC card and a communication system utilizing the same.

FIG. 5 shows a general example of a communication system utilizing an IC card. The communication system of FIG. 5 comprises an IC card 10a having an independent data and a card-gate apparatus 20a, which apparatus serves to transmit an electromagnetic wave to supply electric power to the IC card 10a, as well as perform transmission and reception of data. The IC card 10a comprises an antenna 22a for receiving an electromagnetic wave, a rectifying circuit 11 with a capacitor 6 to rectify the received electromagnetic wave for creation of electric power, a power source circuit 12 for supplying an internal circuit of the IC card 10a with power source voltage created from the obtained electric power, a wave-detecting circuit 13 for detecting a data component from the received electromagnetic wave, a modulating/demodulating circuit 14 for demodulating the received data and modulating data to be transmitted, an oscillating circuit 1 for generating a clock signal CP to be supplied into internal circuits, a control circuit formed by a micro-computer and memories, not shown, respectively for processing and storing the obtained data.

On the other hand, the card-gate apparatus 20a comprises a modulating circuit 14a for modulating an electric power signal and a data signal to be transmitted to the IC card 10a, an antenna 22f for transmitting electromagnetic waves for carrying them, an antenna 22g for receiving an electromagnetic wave from the IC card 10a, a detecting circuit 13b for detecting a data component of the received electromagnetic wave from the IC card 10a, a demodulating circuit 14d for demodulating the detected data, and a control circuit 15a for processing the demodulated data to permit the card-gate apparatus, not shown, to perform control depending on the result of data processing. The control circuit 15a comprises a semiconductor device such as a micro-computer and memories, whereas the card-gate apparatus is constituted by a gate device for controlling passage, a guiding display, and so on.

Figure 6:
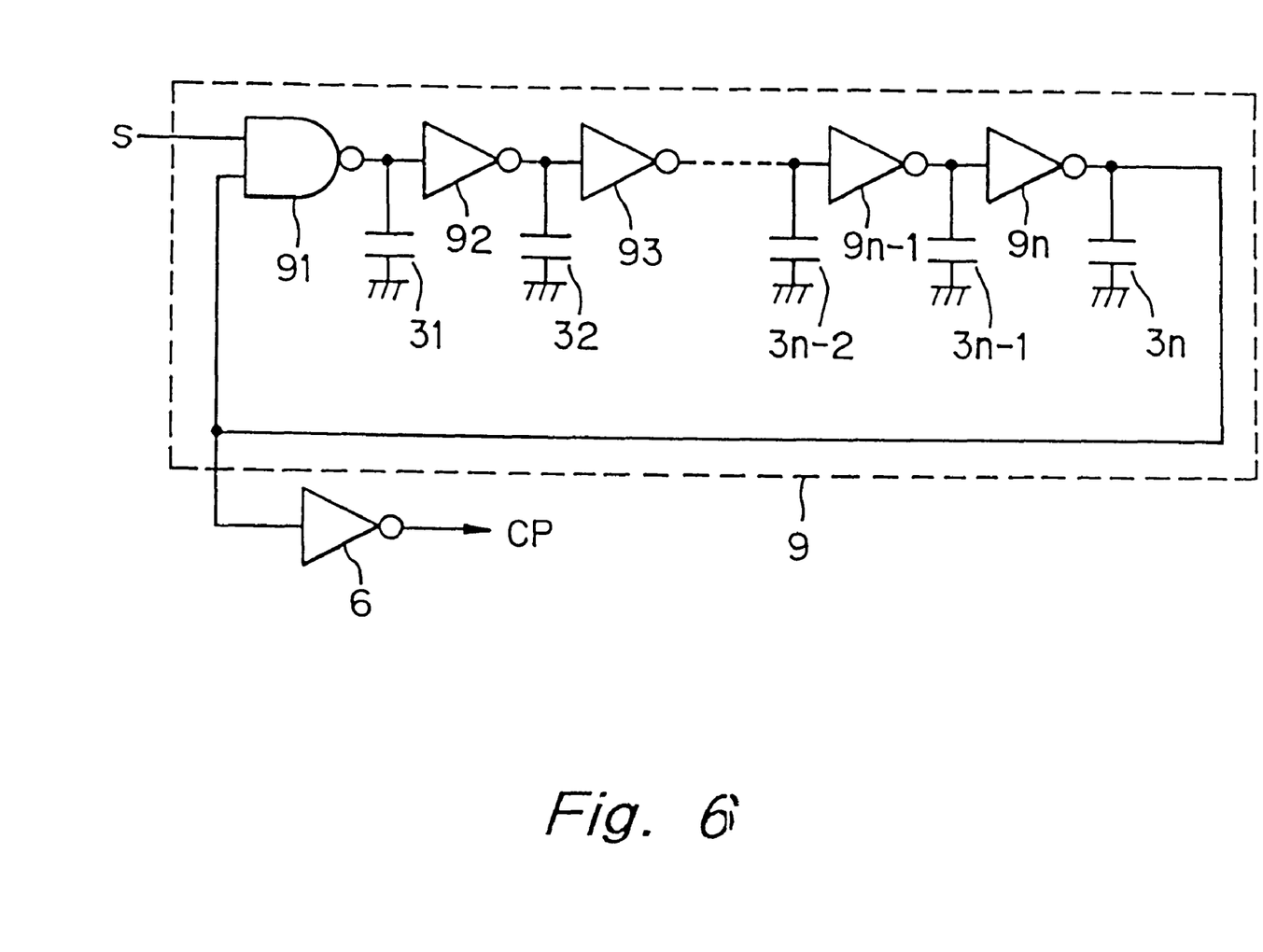
FIG. 6 is a circuit diagram showing a conventional example of an oscillation circuit.

Conventionally, there have been oscillator circuits, which are incorporated into the IC card 10a, such as CR oscillator circuits and ring oscillator circuits, which are easy to configure for integration for a semiconductor device without using components such as ceramic-quartz oscillators and inductance elements. These circuits were often used by incorporation within a semiconductor device. There is shown as an example in FIG. 6 a ring oscillating circuit 9 of a CMOS structure having odd numbers of signal inverters $9m$, wherein m=1–n: n is a positive odd number, of such as NAND circuits and inverter circuits. These signal inverters have their input and output terminals for connection of tandem in the form of a ring. The signal inverters $9m$ have delaying capacitors $3m$, respectively, connected to output terminals thereof. The inverter $9n$ is connected for supply a signal to one input terminal of a NAND $9_1$ as well as to an input terminal of an inverter 6 whose output terminal is connected to supply a clock signal CP to other circuitry, not shown, where it can be used as a reference clock for a semiconductor device. The other input terminal of the NAND $9_1$ is connected to be supplied with a control signal S for enabling control of commencement and halt of oscillation.

In the meanwhile, ring oscillating circuits, CR oscillating circuits, etc. as stated above were used without problem in devices such as toys, where close precision is not necessary for oscillation frequency. However, they were difficult to use as a device for a card-gate system utilizing an IC card of the proximity type, due to reasons as discussed below.

That is, there is a demand for relatively close precision in oscillation characteristics in a card-gate system utilizing a proximity type IC card, due to the necessity of matching in timing of data transmission and reception between an IC card and a card-gate apparatus. However, an IC card has solely a power source where an electromagnetic wave transmitted from a card-gate apparatus, etc. is received and rectified therein to charge electricity on a capacitor, so that the voltage of the power source is apt to vary depending on the distance from the card-gate apparatus or a state of data reception. The variation of power source voltage causes variation in drivability of each signal inverter, so that each capacitor is changed of its charging or discharging current to vary delay time among the signal inverters, thereby resulting in variation in oscillation frequency. The drivability of each signal inverter also is readily varied by change of temperature or variation of device characteristics incurred through fabrication of a semiconductor device. Thus, oscillation frequency is further varied.

In this manner, the oscillation frequency is varied by various factors. As a consequence, the median oscillation frequency was conventionally controlled by altering the size or the number of transistors involved in a signal inverter, or otherwise vary the size of capacitors to alter the capacitance value. These alterations, however, is impractically troublesome because it necessitates a change of masking or the like used during fabrication of a semiconductor device.

As for oscillating circuits built-in semiconductor devices, there were also no techniques to suppress the variation of oscillation frequency, but for limiting such condition as power source voltage and temperature to meet the frequency-precision requirement.

Incidentally, the usage of external component parts such as discrete oscillators is expected to readily improve the frequency precision. However, it is still difficult to adopt, because an IC card as a product has a limitation in its thickness, the external-part mounting makes the substrate area large, the increased number of pins becomes necessary for packaging, the cost is raised by additional expensive cost, including control cost, for external parts.

It is therefore the object of the invention to form within a semiconductor device an oscillation circuit for presenting an oscillation frequency, which is relatively precise over a wide range of power source voltage and temperature and easy to alter, thereby facilitating the provision of a semiconductor device with less external parts used.

The communication system utilizing an IC card will then be explained briefly based on an example of a general use with reference to FIG. 5. A battery as a power source or the like is not incorporated in the IC card 10a. Consequently, an electric power necessitated by the IC card 10a is given by an electromagnetic wave having a frequency ranging from several hundreds of kilo-hertz to several mega-hertz, which wave is received by the antenna 22a of the IC card 10a upon passing by near the card-gate apparatus provided at a skiing-ground rift gate, etc. The received wave is rectified by the rectifying circuit 11, followed by charging on a capacitor or the like for obtaining necessitated electric power. Only while electric power is sufficient, a given level of power-source voltage is generated by the power source circuit 12, which is supplied to the internal circuit of the IC card 10a for reception, processing, and transmission of data.

The above stated communication system enables the content of data to be confirmed through reciprocal communication through electromagnetic waves without contacting between the IC card 10a and the card-gate apparatus 20a. This eliminates the necessity as required in the conventional magnet-type card of such as taking the card out of a pocket and opening a vehicular window for passing the card through a card-gate apparatus whenever-going through a gate, thereby shortening examination time period with relieved congestion at the gate. Owing to such conveniences, the proximity IC card and the communication system are expected to be in wider use in applications, such as confirming fees on expressways, from now on.

In the conventional IC card, however, communication is possible only while electric power can be supplied after being sufficiently stored on a capacitor through rectification of the received electromagnetic wave. Hence, there is present a problem that the rate of communication cannot be increased because of the necessity of frequent repetition of charging electricity each time the stored electric power becomes insufficient. Another problem lies in that the communication distance cannot be taken longer for a shorter charging time period, because the longer the communication distance the longer duration is necessary for charging electricity. Further, there is left other problem that the antenna of the IC card is used common for getting electric power as well as transmitting/receiving data so that the switching-over between the electric-power reception and the data transmission/reception must be performed depending on a situation. To this end, the IC card is complicate in its internal circuit together with a program thereof, thus extending a development term.

Moreover, ring oscillating circuits, CR oscillating circuits, etc. as stated above were used without problem in devices such as toys, where close precision is not necessary for oscillation frequency. However, they were difficult to use as a device for a card-gate system utilizing an IC card of the proximity type, due to reasons as discussed below.

That is, there is a demand for relatively close precision in oscillation characteristics in a card-gate system utilizing a proximity type IC card, due to the necessity of matching in timing of data transmission and reception between an IC card and a card-gate apparatus. However, an IC card has solely a power source where an electromagnetic wave transmitted from a card-gate apparatus, etc. is received and rectified therein to charge electricity on a capacitor, so that the voltage of the power source is apt to vary depending on the distance from the card-gate apparatus or a state of data reception. The variation of power source voltage causes variation in drivability of each signal inverter, so that each capacitor is changed of its charging or discharging current to vary delay time among the signal inverters, thereby resulting in variation in oscillation frequency. The drivability of each signal inverter also is readily varied by change of temperature or variation of device characteristics incurred through fabrication of a semiconductor device. Thus, oscillation frequency is further varied.

In this manner, the oscillation frequency is varied by various factors. As a consequence, the median oscillation frequency was conventionally controlled by altering the size or the number of transistors involved in a signal inverter, or otherwise vary the size of capacitors to alter the capacitance value. These alterations, however, is impractically troublesome because it necessitates a change of masking or the like used during fabrication of a semiconductor device.

As for oscillating circuits built-in semiconductor devices, there were also no techniques to suppress the variation of oscillation frequency, but for limiting such condition as power source voltage and temperature to meet the frequency-precision requirement.

Incidentally, the usage of external component parts such as discrete oscillators is expected to readily improve the frequency precision. However, it is still difficult to adopt, because an IC card as a product has a limitation in its thickness, the external-part mounting makes the substrate area large, the increased number of pins becomes necessary for packaging, the cost is raised by additional expensive cost, including control cost, for external parts.

It is therefore the object to provide an IC card which is easy to develop of a circuit configuration and a program, as well as a communication system having characteristics improved of communication rate, communication distance, etc.

It is another object to form within a semiconductor device an oscillation circuit for presenting an oscillation frequency, which is relatively precise over a wide range of power source voltage and temperature and easy to alter, thereby facilitating the provision of a semiconductor device with less external parts used.

DISCLOSER OF THE INVENTION

In order to solve the above stated problems, there is provided in claim 1 a semiconductor device comprising: a ring oscillation circuit including a plurality of signal inverters, wherein odd numbers of which are tandem connected in the form of a ring; and a constant-current circuit being set to a current value smaller than electric-current ability for transistors involved in said signal inverter, said constant-current circuit being connected in series to at least one of said transistors connected supplied with a power source voltage or a reference voltage.

There is also provided in claim 2 an IC card device comprising: a first antenna for obtaining electrical power by receiving an external electromagnetic wave and rectifying; and a second antenna for transmitting and receiving data based on the electric power, the second antenna being provided independent of said first antenna.

There is also provided in claim 3 an IC card according to claim 2, the IC card further comprising: a ring oscillation circuit including a plurality of signal inverters, wherein odd numbers of which are tandem connected in the form of a ring; and a constant-current circuit being set to a current value smaller than electric-current ability for transistors involved in said signal inverter, said constant-current circuit being connected in series to at least one of said transistors connected supplied with a power source voltage or a reference voltage.

There is also provided in claim 4 a communication system comprising: an IC card incorporating therewithin a semiconductor integrated circuit and at least one antenna so as to obtain electric power by receiving an external electromagnetic wave and rectifying, the IC card transmitting and receiving data based on the electric power; and a card gate apparatus having a first antenna for transmitting the electromagnetic wave for electric power and a second antenna for transmitting and receiving the data, the second antenna being provided independent of said first antenna.

There is also provided in claim 5 a communication system according to claim 4, wherein said second antenna comprises a transmission antenna for transmitting said data and a reception antenna, which is provided independent of said transmission antenna, for receiving said data.

There is also provided in claim 6 a communication system according to claim 4, wherein said second antenna is switched according to the uses for transmission and reception of the data.

There is also provided in claim 7 a communication system according to any one of claims 4 to 6, wherein said card gate apparatus transmits each electromagnetic wave such that the range of distance over which the electromagnetic wave for electric power reaches is longer than that of the electromagnetic wave for transmission of data.

The semiconductor device of claim 1, using the above stated circuit configuration for the oscillation circuit, can suppress the variation in delay time for the signal inverters involved in the oscillation circuit when the power-source voltage or the temperature varies. Also, in the IC card device of claim 2, the oscillator undergoing less variation in oscillation frequency is easily formed with reduced number of external parts.

According to a structure of the IC card of the invention, there are provided independently an antenna 2a for obtaining electric power and an antenna 2b for transmission and reception of data so that transmission and reception of data can be made by the antenna 2b while receiving electric power necessitated for operating an IC card.

BEST MODE FOR CARRYING OUT THE INVENTION

A preferred embodiment of the invention will now be explained hereinbelow in detail by referring to FIGS. 1 to 3.

Figure 1:
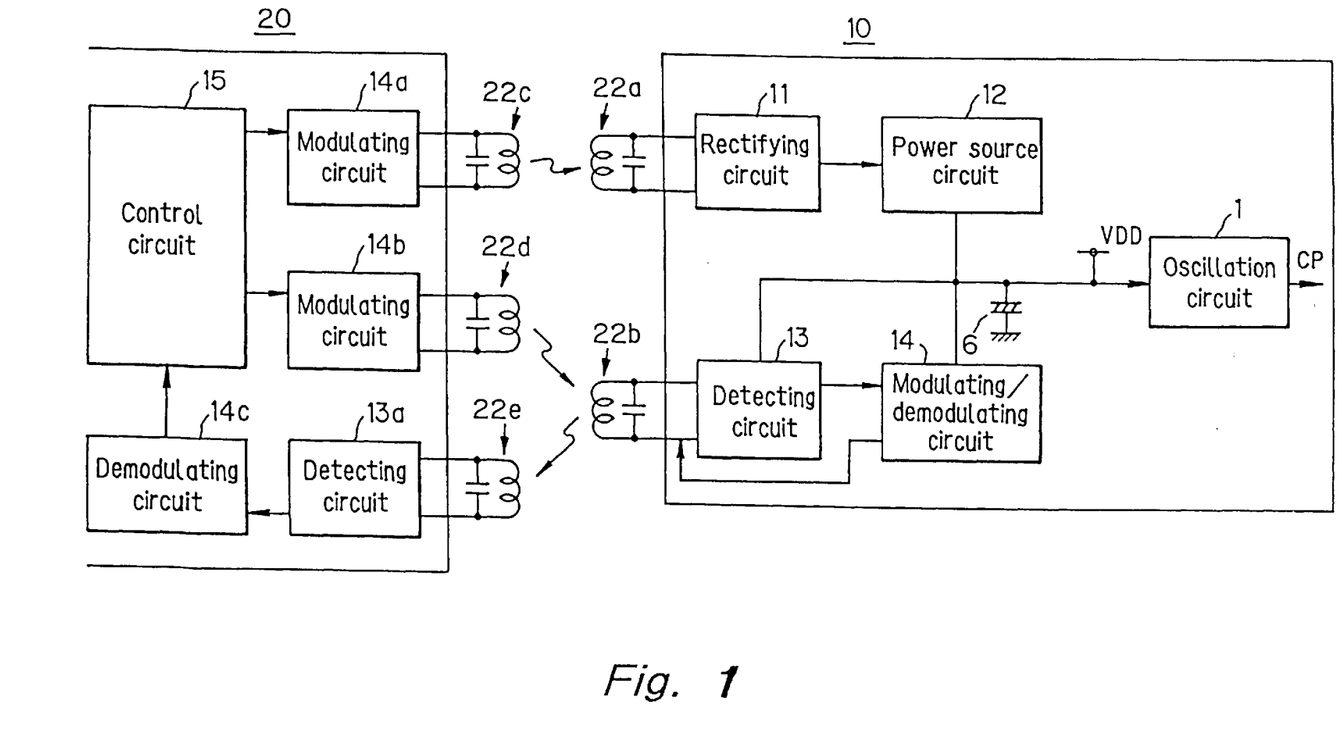
FIG. 1 is an explanatory diagram showing a structure of an IC card and a communication system utilizing the same.

FIG. 1 illustrates an example of a structure of an IC card and a communication system utilizing the same according to the invention. The communication system of FIG. 1 comprises an IC card 10 possessing independent data, and a card-gate apparatus 20 for transmitting an electromagnetic wave to supply electric power to an IC card, and performing transmission and reception of a given data therebetween. The IC card comprises an antenna 22a for receiving an electromagnetic wave for providing electric power, an antenna 22b for receiving an electromagnetic wave for data, a rectifying circuit 11 with a capacitor 6 to rectify the received electromagnetic wave to get electric power, a power-source circuit 12 for supplying a power-source voltage to an internal circuit of the IC card 10 by the use of electric power obtained, a detecting circuit 13 for detecting a data component contained in the received electromagnetic wave, a modulating/demodulating circuit 14 for demodulating the received data and modulating data to be transmitted, a oscillating circuit for generating a clock signal CP to be supplied into internal circuits, and a semiconductor device such as a micro-computer and FLASH or involatile memories. The power-source circuit 12 includes a reference-voltage creating circuit for creating a reference voltage from the obtained electric power, a voltage clamping circuit to compare the power-source voltage with a reference voltage so as to render the value of the source voltage constant, and a power-source-voltage detecting circuit for outputting a signal for initializing or halting the operation of the IC card 10.

The card-gate apparatus 20, on the other hand, comprises a modulating circuit 14a for modulating an electric-power signal to be transmitted to the IC card 10, an antenna 22c for transmitting an electromagnetic wave containing the same signal, a modulating circuit 14b for modulating a data signal to be transmitted to the IC card 10, an antenna 22d for transmitting an electromagnetic wave containing the same signal, a detecting circuit 13a for detecting a component of data contained in the received electromagnetic wave from the IC card 10, a demodulating circuit 14c for demodulating the detected data, and a control circuit 15 for processing the demodulated data to perform control on the card-gate apparatus, not shown, depending on the result of the data processing. The control circuit 15 is formed by semiconductor devices such as a micro-computer, memories, etc., while the card-gate apparatus is formed by a gate device, a guiding display, etc., for control of the gate passage.

Figure 2:
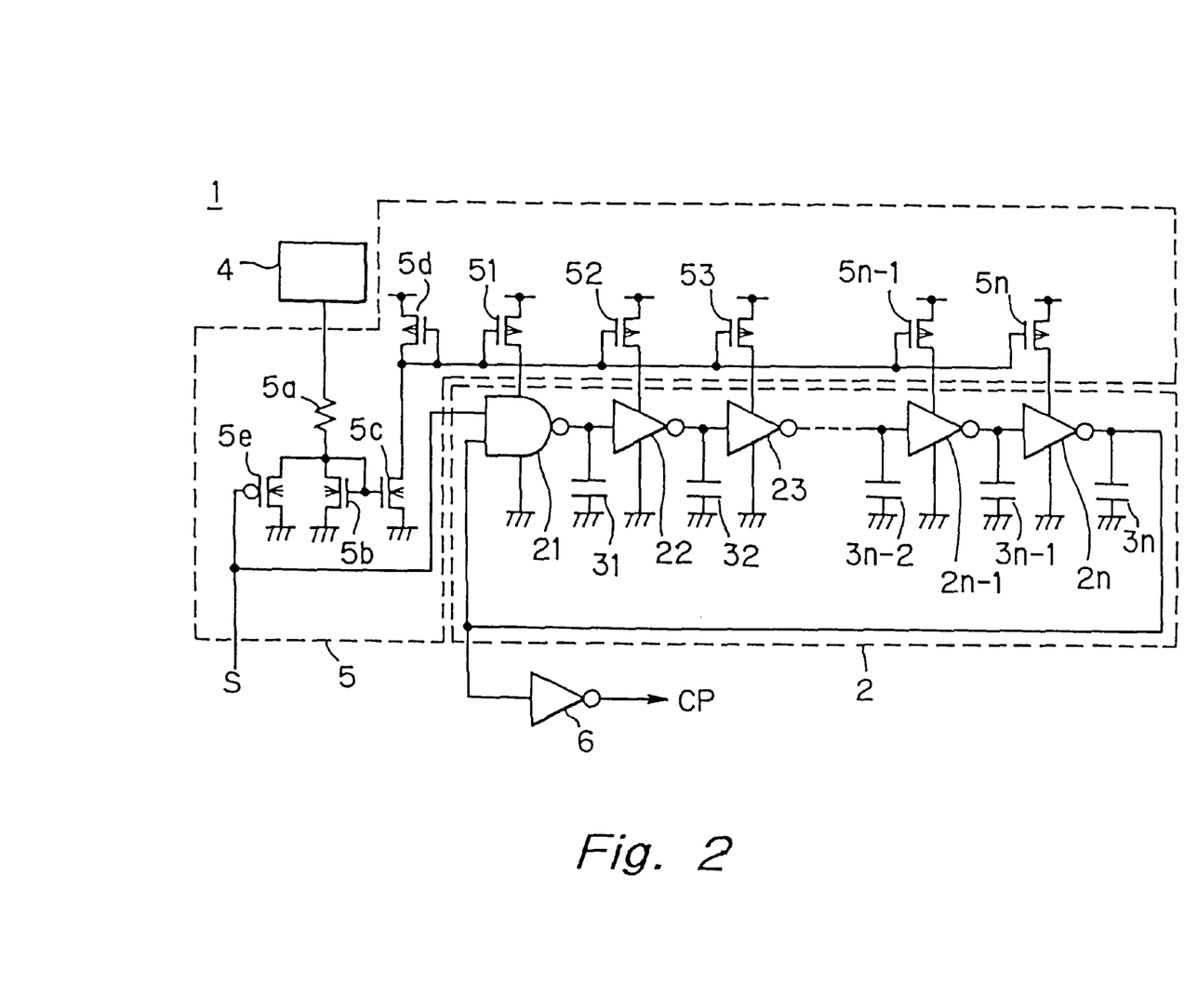
FIG. 2 is a circuit diagram showing an oscillating circuit according to the invention.

FIG. 2 illustrates an oscillating circuit 1 according to an embodiment of the invention. The oscillating circuit 1 comprises a ring oscillating circuit portion 2 having a plurality of signal inverters connected tandem in the form of a ring, a constant-current circuit portion 5 having connections to respective signal inverters to limit output currents therefrom, and a constant-voltage circuit 4 for generating a constant voltage as a reference for prescribing an electric current value to be supplied to each of the signal inverters.

The structure of the ring oscillating circuit portion 2 and the constant-current circuit portion 5 will be explained in further detail. The ring oscillating circuit portion 2 has signal inverters 2m in numbers of n, wherein m=1–n; n=a positive odd number, which are each formed in a MOS structure by inverter circuits, NAND circuits, etc., with input and output terminals connected tandem in the form of a ring. The signal inverters 2m have output terminals, respectively, connected with capacitors 3m for delaying transmission of an output signal therefrom. Each signal inverter 2m has a reference-voltage side transistor directly connected to a reference voltage, similarly to the conventional signal inverter circuit, and a power-source side transistor connected to a power source via a corresponding constant-current source 5m of a constant-current circuit 5. With such structure, each signal inverter 2m is given an output current and the resultant delay time which are to be kept almost constant independently of variation in drivability thereof.

The constant-current circuit portion 5 serves to generate a constant electric current based on the constant voltage from the constant-voltage circuit 4 by the use of a resistor 5b and an NMOS-type transistor 5b in diode-connection. The constant-current circuit portion 5 comprises a transistor 5c connected to the transistor 5b in a current-mirror form, a transistor 5d acting as a load for the transistor 5c, a plurality of PMOS-type transistors 5m, m=1–n, connected to the transistor 5d in a current-mirror relation, and a transistor 5e for controlling the operation of the constant-current circuit portion 5. The transistors 5m are insertionally connected, respectively, in series to the power-source side transistors of the signal inverters 2m.

A control line S is connected to the transistor 5e and to the one input terminal of the NAND circuit 21 for enabling commencement and halt of oscillating. The inverter circuit 2n has an output terminal thereof, which is connected by feedback to the NAND circuit 21, is also connected to an input terminal of the inverter circuit 6. The output of the inverter circuit 6 is connected to other circuits, not shown, for supplying a clock signal CP, so as to determine timing of operation of the semiconductor device.

Incidentally, although the capacitors 3m may be each constituted by solely a parasitic capacitance of an interconnection or a diffusion layer, it will be able to cope with further low oscillation frequency with improved fabrication-oscillation-frequency precision, if the capacitance value is increased by providing a separate capacitance element. The constant-voltage circuit 4 may be formed by a usual constant-voltage circuit using a diode forward-bias voltage or a zener-diode zener voltage, the explanation on a detailed structure thereof being omitted.

The operation of the circuits will then be explained. When the voltage in the control line S is in a low level, the output of the NAND circuit 21 is held in a high level and no constant current is supplied to each of the signal inverters. Consequently, each signal inverter keeps the immediately-before output state, to thereby halt oscillating.

On the other hand, when the voltage in the control line S becomes to a high level, the output of the NAND circuit 21 is first inverted to a low level and electricity charged on the capacitor 31 is abruptly discharged. If the charge voltage of the capacitor 31 becomes lower than an input threshold voltage of the inverter circuit 22, the output of the inverter circuit 22 is inverted to thereby charge the capacitor 32 with a constant current from the transistor 52. During the charging process, when the charge voltage of the capacitor 32 goes higher than an input threshold voltage of the inverter circuit 23, the output of the inverter circuit 23 is inverted to cause the capacitor 33 to discharge electricity. If the operation of charging and discharging as stated is repeated through the signal inverters 2m, the NAND circuit 22 will be fed back by a signal with a voltage level different from that of the previous one, because the signal inverters in odd numbers are connected in a ring form. Thus, oscillation is caused to continue.

In this manner, each capacitor 3m is charged by a constant current supplied from a transistor 5m, thus, if the value of constant current of the constant-current circuit portion 5 is set such that charging is sufficiently longer in time period than discharging, this is for the purpose of setting to the value of constant current smaller than electric current ability for transistors 5m, each of the signal inverters is given an almost constant delay time regardless of variation in drivability between the signal inverters due to fluctuations in power source voltage, thereby keeping oscillation frequency almost constant.

Incidentally, the alteration of oscillation frequency is possible by changing the number of the signal inverters or the capacitance value of the capacitors, in a manner similar to the conventional. In the present embodiment, however, each of the signal inverters can be altered of its output current and the resultant delay time by simply attaching externally a resistance 5a, which resistance is for determining the value of constant current, to change the resistance value. Thus, oscillation frequency is easy to alter.

Figure 3:
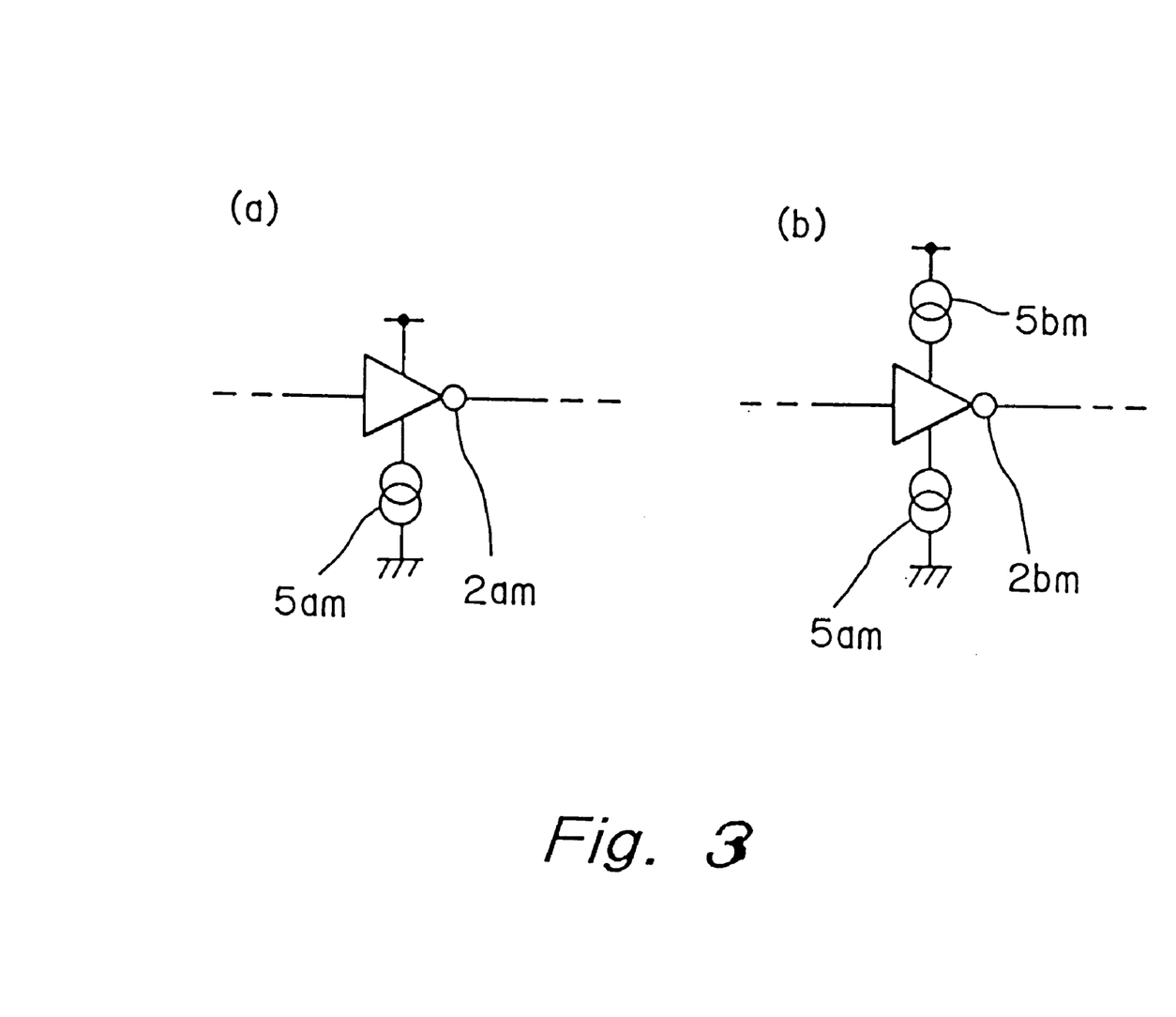
FIG. 3 is a circuit diagrams showing another example of signal inverters usable in the invention.

FIG. 3 shows another embodiment of CMOS-structured signal inverters usable in the invention, (a) of FIG. 3 shows an inverter circuit configuration in a connection state, wherein a transistor involved on the side of a power line in a signal inverter 2am, m=1–n, is directly connected to a power source similarly to the conventional inverter circuit, and a transistor on the side of a reference potential line is insertionally connected in series to a constant current circuit 5am, m=1–n. An oscillation circuit is to be constituted by tandem connecting a plurality of such signal inverters in a ring form, with a constant current set by a constant current circuit structured similarly to FIG. 1. (b) of FIG. 3 shows a case, wherein constant current sources 5am and 5bm, m=1–n, are insertionally connected, respectively, in series to transistors, which transistors are respectively connected to a power source line and a reference potential line, further improving the accuracy in oscillation frequency.

An example of usage of the communication system utilizing the IC card will then be explained based on reference to FIG. 1. The electric power necessitated for the IC card 10 is to be acquired by receiving a weak electromagnetic wave of several micro-watts with a frequency of approximately several hundreds of kilo-hertz, which is transmitted from the antenna 22c of the card-gate apparatus 20, by the antenna 22a of the IC card 10, so that the received electromagnetic wave is rectified by the rectifying circuit 11 to charge a capacitor, etc. The electric power thus obtained serves to create a given level of power voltage which is supplied to the internal circuit of the IC card 10. During reception of the electric power being supplied, simultaneously, the electromagnetic wave, which contains data for requesting confirmation on the frequency-of-usage, is transmitted from the data antenna 22d of the card-gate apparatus 20. The transmitted wave is received by the antenna 22b, detected by the detecting circuit 13, demodulated of data by the modulating/demodulating circuit 14, to thereby drive the control circuit such as a micro-computer to perform rewriting on data, such as for fees and the number of times. The result of rewritten data is modulated by the modulating/demodulating circuit 14 and then transmitted from the antenna 22b to the card-gate apparatus 20. This electromagnetic wave is received by the antenna 22e of the card-gate apparatus 20, detected by the detecting circuit 13a to be demodulated by the demodulating circuit 14c, and then data-processed by the control circuit 15, thereby enabling the card-gate apparatus 20 to confirm an ID number or a using state of the IC card so as to pass or stop solely permissible persons or things, display to guide toward a given direction, or update again data of the IC card 10.

The communication system in FIG. 1 may reduce the cross-talk of data by using an electromagnetic wave with a frequency lower than 500 kHz for electric power together with an electromagnetic wave with a frequency higher than 1 MHz for data, for instance. Also, if the IC card be given in advance with electric power by strengthening the electric field for an electric-power electromagnetic wave than that of data electromagnetic wave, or otherwise directing the directivity of the electric-power electromagnetic wave farther than that of the electromagnetic wave for data, communication by data may be effected in a brief time with higher efficiency. With such structure, data exchange may be positively made even when passing at a considerably high speed through a gate for payment on expressway fees. Further, antennas for receiving and transmitting of the card-gate apparatus 20 may be provided jointly and switched according to the uses therefor.

In the communication system in FIG. 1, the IC card using the conventional oscillation circuit took long time to write data into a memory due to long retardation in transmitting an oscillation-frequency signal, when a power source voltage thereof is low due to reception of a low-level signal at a place distant from a transmitter of the card-gate apparatus. In contrast to this, the IC card 100 using the oscillation circuit of the invention, as used in a manner stated above, can carry out data processing within an almost constant period of time through oscillation frequency stably provided, even when the power source voltage is low. The uniformity of processing time period prevents electric current from being consumed in the oscillation circuit so that saved power can be used for transmission for extending communication distance.

Incidentally, the IC card of the present invention is not limited to the structure shown by the embodiment of FIG. 1, but all the circuit functions of FIG. 1 may be integrated in a single chip or otherwise in a plurality of chips by circuit function. The memory device may be such an involatile memory that can store data therein without a power source voltage, which may be one incorporated in a microcomputer, etc. Further, the oscillation circuit of the invention can be used for a reference clock signal for a VTR or TV set.

The structure of the IC card of the invention may be similar to the structure as discussed on the prior art, but is not limited thereto. For the fixing resin 34 for instance, thermoplastic resins such as polybutylene-terephthalate (PBT), or thermosetting resins possessing insulation such as epoxy resins and phenol resins are usable for instance, besides the plastic resin stated hereinbefore. As for films 33, a film which is withstandable at a temperature of approximately 150 degree centigrade is also applicable, in addition to the PET stated before. It is satisfactory to provide such film onto at least one of upper and lower sides of the IC card. The substrate 31 may be located outside the antenna coil 32 in a manner independent of location and size of the substrate, though it is provided inside the antenna coil 32 in FIG. 1. Further, the substrate and antenna, if accommodated by pasting in recesses provided in the resin casing, may not require fixing with a resin.

Further, the antennas 22a and 22b may be placed in their coiled portions in an independent or concentric relation along the plane, or otherwise superposed in coiled portions along the thickness. These antennas may be configured in the form of a plate or a tube, beside a coiled form. An involatile memory including one incorporated in a microcomputer is usable, if adapted to retain memorized data even when a power source is turned off, besides a FLASH memories mentioned before.

INDUSTRIAL APPLICABILITY

As described above, the semiconductor device according to claim 1 of invention can suppress the variation of delay time of signal inverters in an oscillation circuit upon fluctuation in power-supply voltage and temperature so that the delay time is kept almost constant by a delaying circuit of the signal inverters with capacitors, thereby providing an effect of suppressing the variation of oscillation frequency over a wide range of power-supply voltage and temperature. Also, there is provided another effect of facilitating the adjustment on oscillation frequency at an initial stage solely by altering a constant-current value prescribing an output current from the signal inverters so as to properly alter oscillation frequency.

According to the IC card of claim 2 and the communication system of claim 4, transmission and reception of data can be made by the antenna 22b while receiving electric power necessitated for operating an IC card, thus, both electric power charge and transmission and reception of data can be performed at the same time without switching thereof, moreover, necessitated electric power is quickly charged by charging all the time, thereby providing effects of improving the characteristics in communication rate and communication distance with circuit configuration and program development facilitated. Moreover, the two independent antennas can omit a resonant capacitor provided with data transmission and reception antenna in the case that a frequency range of the antenna for transmission and reception of data makes higher than that of the antenna for reception for electric power. Further, the antennas can make a capacity of capacitor for storage small for the reason of charge all the time.

Further, the IC card according to claim 3 has an oscillator which is easy to manufacture with less external parts used, providing the effect of facilitating the supply of IC cards capable of positive data transmission and reception.

What is claimed is:

1. An IC card device comprising:
   a first antenna for obtaining electrical power by receiving an external electromagnetic wave and recfifying;
   a second antenna for transmitting and receiving data based on the electric power, the second antenna being provided independent of said first antenna;
   a ring oscillation circuit including a plurality of signal inverters, wherein odd numbers of which are tandem connected in a form of a ring; and
   a constant-current circuit being set to a current value smaller than electric-current ability for transistors involved in said signal inverter, said constant-current circuit being connected in series to at least one of said transistors connected supplied with a power source voltage or a reference voltage.

2. An IC card according to claim 1, the current value is generated based on a constant voltage from a constant-voltage circuit.

3. An communication system comprising:
   an IC card incorporating therewithin a semiconductor integrated circuit, at least one antenna so as to obtain electric power by receiving an external electromagnetic wave and rectifying, the IC card transmitting and receiving data based on the electric power, a ring oscillation circuit including a plurality of signal inverters, wherein odd numbers of which are tandem connected in a form of a ring, and a constant-current circuit being set to a current value smaller than electric-current ability for transistors involved in said signal inverter, said constant-current circuit being connected in series to at least one of said transistors connected supplied with a power source voltage or a reference voltage; and a card gate apparatus having a first antenna for transmitting the electromagnetic wave for the electromagnetic wave for electric power, and a second antenna for transmitting and receiving data, the second antenna being provided independent of said first antenna.

4. A communication system according to claim 3, wherein said second antenna comprises a transmission antenna for transmitting said data and a reception antenna, which is provided independent of said transmission antenna, for receiving said data.

5. A communication system according to claim 3, wherein said second antenna is switched according to uses for transmission and reception of the data.

6. A communication system according to any one of claims 3 to 5, wherein said card gate apparatus transmits each electromagnetic wave such that a range of distance over which the electromagnetic wave for electric power reaches is longer than that of the electromagnetic wave for transmission of the data.

* * * * *

UNITED STATES PATENT AND TRADEMARK OFFICE
CERTIFICATE OF CORRECTION

| | |
|---|---|
| PATENT NO. | : 6,223,990 B1 |
| APPLICATION NO. | : 08/973564 |
| DATED | : May 1, 2001 |
| INVENTOR(S) | : Shinji Kamei |

It is certified that error appears in the above-identified patent and that said Letters Patent is hereby corrected as shown below:

In the Specification

Column 1, line 18, "rifts," should read --lifts,--.

Column 2, line 29, "$9_1$" should read --91--.

Column 2, line 59, "was" should read --is--.

Column 2, line 62, "vary" should read --varying--.

Column 2, line 63, "is" should read --are--.

Column 2, line 64, "it necessitates" should read --they necessitate--.

Column 3, line 26, "rift" should read --lift--.

Column 3, line 40, "whenever-going" should read --whenever going--.

Column 3, line 66 through Column 4, line 44, should be deleted.

Column 4, line 56, "DISCLOSER", should read --DISCLOSURE--.

Column 4, line 59, delete "in claim 1".

Column 5, line 1, delete "in claim 2".

Column 5, line 7, delete "in claim 3".

Column 5, line 17, delete "in claim 4".

Column 5, line 27, delete "in claim 5".

Column 5, line 28, delete "according to claim 4".

Column 5, line 32, delete "in claim 6".

Column 5, line 33, delete "according to claim 4".

UNITED STATES PATENT AND TRADEMARK OFFICE
CERTIFICATE OF CORRECTION

PATENT NO. : 6,223,990 B1
APPLICATION NO. : 08/973564
DATED : May 1, 2001
INVENTOR(S) : Shinji Kamei It is certified that error appears in the above-identified patent and that said Letters Patent is hereby corrected as shown below:

Column 5, line 37, delete "in claim 7".

Column 5, line 38, delete "according to one of claims 4 to 6".

Column 5, line 43, delete "of claim 1".

Column 5, line 48, delete "of claim 2".

Column 7, line 47, "zener (both occurrences)" should read --Zener--.

In the Claims

Column 10, line 48, "recfifying" should read --rectifying--.

Column 10, line 62, "the" should read --wherein the--.

Column 10, line 65, "An" should read --A--.

Signed and Sealed this

Eighth Day of April, 2008

JON W. DUDAS
*Director of the United States Patent and Trademark Office*